United States Patent [19]

Rosen et al.

[11] 4,319,265
[45] Mar. 9, 1982

[54] MONOLITHICALLY INTERCONNECTED SERIES-PARALLEL AVALANCHE DIODES

[75] Inventors: Arye Rosen, Cherry Hill; Jerome B. Klatskin, Cranbury, both of N.J.

[73] Assignee: The United States of America as represented by the Secretary of the Army, Washington, D.C.

[21] Appl. No.: 101,405

[22] Filed: Dec. 6, 1979

[51] Int. Cl.³ .............. H01L 23/32; H01L 29/90; H01L 29/06

[52] U.S. Cl. .................. 357/76; 357/13; 357/56; 357/72; 357/75; 357/81

[58] Field of Search ............... 357/76, 77, 81, 75, 357/56, 13, 72

[56] References Cited

U.S. PATENT DOCUMENTS

| | | | |
|---|---|---|---|
| 2,847,623 | 8/1958 | Thornhill | 357/76 |
| 3,165,678 | 1/1965 | Bernstein | 357/77 |
| 3,249,827 | 5/1966 | Benda et al. | 357/77 |
| 3,263,092 | 7/1966 | Knauss | 357/76 |
| 3,383,760 | 5/1968 | Shwartzman | 357/76 |
| 3,619,731 | 11/1971 | Baker | 357/76 |
| 3,953,254 | 4/1976 | Valdman | 357/76 |
| 4,243,894 | 1/1981 | Kuntner | 357/81 |

FOREIGN PATENT DOCUMENTS

| | | | |
|---|---|---|---|
| 2325351 | 11/1973 | Fed. Rep. of Germany | 357/76 |
| 51-110278 | 1/1976 | Japan | 357/76 |

*Primary Examiner*—Andrew J. James
*Attorney, Agent, or Firm*—Nathan Edelberg; Jeremiah G. Murray; Michael C. Sachs

[57] ABSTRACT

Disclosed is an array of avalanche diodes and its method of manufacture which results in plural pairs of series connected mesa-etched avalanche (TRAPATT) diodes being selectively connected in parallel by metallized air bridges for increasing the impedance level and thereby the peak and average power level available from microwave oscillators and amplifiers configured therefrom. The various series connected diodes are placed in near proximity to respective neighboring diode pairs to reduce parasitics but at the same time the spacing is made sufficiently large to prevent thermal spreading of one diode pair to overlap that of the adjacent diode pair. The metallized air bridges in addition to providing a low inductance interconnection, provide an integrated heat capacitance which is necessary for high power operation.

6 Claims, 16 Drawing Figures

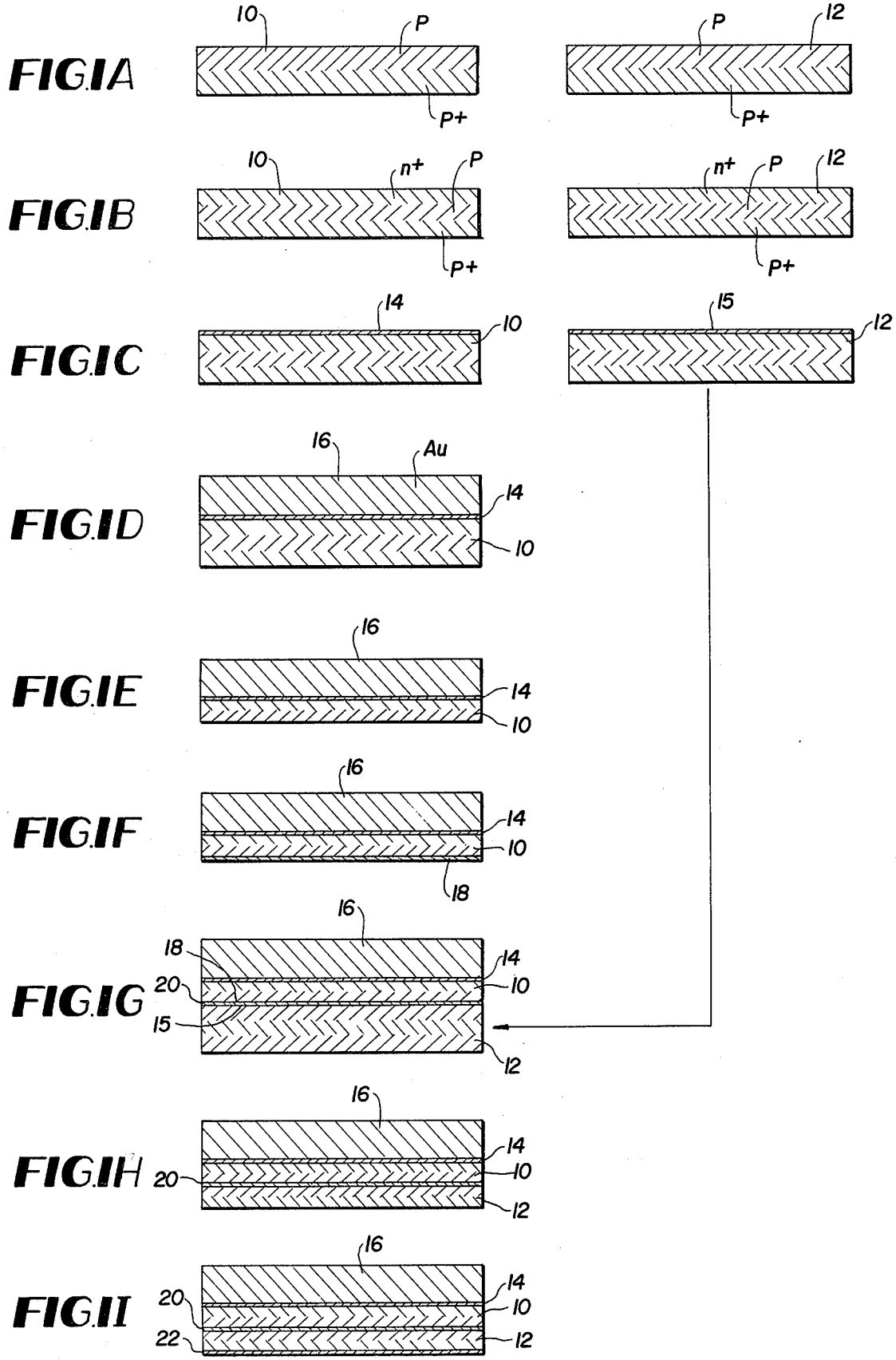

MONOLITHICALLY INTERCONNECTED SERIES-PARALLEL AVALANCHE DIODES

The Government has rights in this invention pursuant to Contract No. DAAB-07-74-C-0180 awarded by the Department of the Army.

BACKGROUND OF THE INVENTION

This invention relates generally to semiconductor devices and more particularly to an avalanche diode array adapted for relatively higher power operation in microwave oscillators and amplifiers.

Monolithically interconnected arrays of avalanche or TRAPATT diodes are known. In an article entitled "Integrated TRAPATT Diode Arrays", by A. Rosen, et al. Which appeared in the October, 1975 issued of the *IEEE Transactions on Microwave Theory and Techniques*, at pp. 841–843, there is disclosed a multiple diode structure of single mesa-etched diodes which are formed and interconnected on a single integrated heat sink and being connected in parallel by means of metallized air bridges which results in a structure having increased power dissipation, due to the fact that the metallized air bridges provide an integrated heat capacitance. While such a design leads to satisfactory performance in certain applications, where increased peak and average power levels are sought to be achieved the paralleling of the diodes in the multiple diode configuration results in reduced impedance levels which in certain applications becomes unacceptable.

SUMMARY

It is an object of the present invention, therefore, to provide a means for generating high peak and average power from solid state microwave sources while maintaining reasonable impedance levels.

It is another object of the present invention to provide a new and improved monolithically interconnected array of active semiconductor devices fabricated by mesa-etching techniques.

And it is a further object of the present invention to provide an avalanche diode array particularly adapted for TRAPATT oscillator and amplifier applications.

Briefly, the subject invention is directed to an improved diode structure and its method of manufacture wherein pairs of series connected avalanche diodes are formed by mesa-etching techniques in an integrated structure with two or more pairs of diodes being monolithically interconnected in parallel by respective metallized air bridges to provide an array which exhibits an increased effective impedance permitting the attainment of higher peak and average power levels from TRAPATT oscillator and amplifier circuit configurations. The method involves joining two bodies in the form of wafers of silicon diffused for TRAPATT applications, on a metal substrate and thereafter performing a pair of mesa-etching steps for forming an array of series connected pairs of avalanche diodes. Thereafter, selected pairs are connected in parallel with metallized air bridges to provide low inductive interconnections as well as integrated heat capacitance. Each pair of series diodes are sufficiently spaced to reduce parasitics but at the same time is sufficient to prevent thermal spreading and overlap necessary for high power-handling capabilities.

DESCRIPTION OF THE PREFERRED EMBODIMENT

Figure 1J:
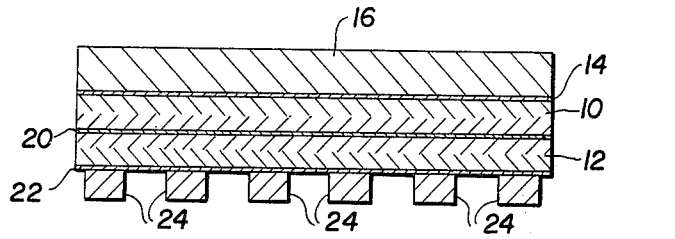
FIGS. 1A through 1P are schematic representations illustrative of the manner in which the series-parallel diode structure of the subject invention is formed.

Referring now to the figures wherein like reference numerals refer to like elements, reference numerals 10 and 12 designate two like silicon wafers diffused for TRAPATT applications, meaning that each wafer constitutes a P on P+ or N on N+ semiconductor body. In FIG. 1A, P on P+ wafers are shown for purposes of illustration. The first step entails diffusing the wafers 10 and 12 with opposite conductivity type material. As shown, N+ diffusion is effected into the wafers 10 and 12 in a manner well known to those skilled in the art. Following the diffusion step of FIG. 1B, respective contact layers of metallization 14 and 15 which may be, for example, a combination of chromium and gold (Cr-Au) is evaporated on the upper or epitaxial side of both wafers. Following this, as illustrated in FIG. 1D, a metal substrate 16 consisting preferably of gold, is plated over the contact layer 14 to a thickness of 5 mils (0.005 inches) on wafer 10. For the sake of clarity these and the following layers are not drawn to scale. Next the wafer 10 is thinned to approximately 1 mil as shown in FIG. 1E. The thinned wafer 10 then has a second contact layer 18 of chromium-gold evaporated on the under or sub side of the wafer. This is illustrated in FIG. 1F.

The next step as shown in FIG. 1G consists of bonding the twin wafer 12 to the underside of wafer 10 using either a well known diffusion welding or a gold alloy process which results in the formation of a composite contact layer 20 or interface. Following the joining of the two wafers 10 and 12, the resulting outer wafer 12 is then thinned to approximately 1 mil thickness as shown in FIG. 1H. A structure of two thinned wafer portions having substantially the same thickness of approximately 1 mil or 0.001 inches now exists. Following the step of thinning wafer 12, an outer chromium-gold contact layer 22 is evaporated on the subside of the wafer 12. This is shown in FIG. 1I.

Figure 1K:
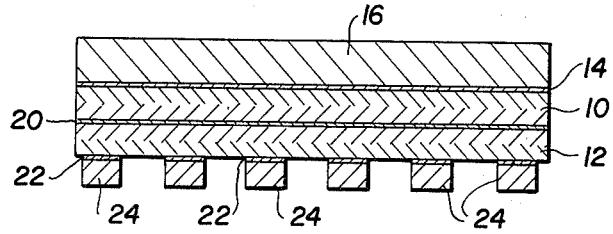
Figure 1L:
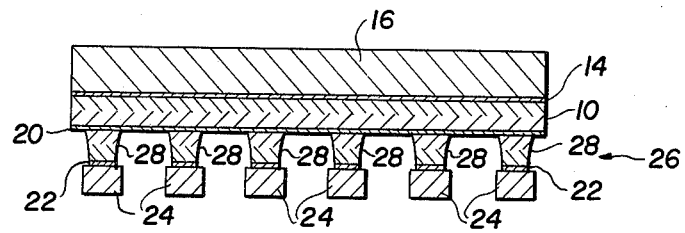

A diode array geometry is now defined on the subside of the wafer 12 by applying a photo-resist pattern, not shown, over the contact layer 22. This is followed by a metal plating step of gold resulting in a substantially equally spaced dot pattern 24 having a thickness of approximately 2 mils which will establish respective diode regions to be subsequently formed. The remaining photo-resist and excess chromium-gold contact layer 22 shown in FIG. 1J are removed as shown in FIG. 1K using the gold pattern 24 as a mask. Next as shown in FIG. 1L, a first set of avalanche or TRAPATT diodes 26 is fabricated in the wafer 12 by well known mesa-etching techniques to form a plurality of silicon diode means 28 as shown in FIG. 1L. Following the fabrication of the first set of avalanche diodes, the chromium-gold interface 20 is removed intermediate the mesas 28 and a second set 30 of avalanche diodes 37 is fabricated in wafer 10 by the same mesa-etching techniques to form a plurality of silicon diode mesas 32 which are connected in series with respective diode mesas 28 through the remaining portions of the contact surface 20. Prior to further fabrication, the series connected array of diodes is tested.

Figure 1M:
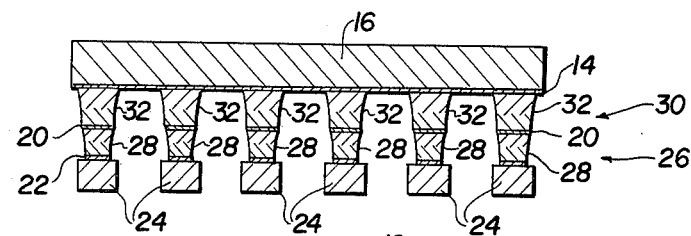
Figure 1N:
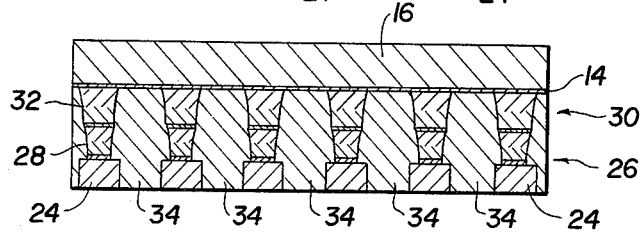
Figure 1O:
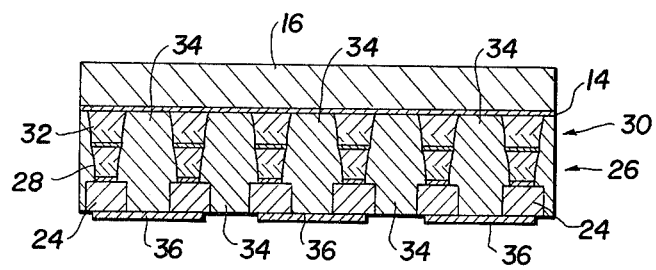
Figure 1P:
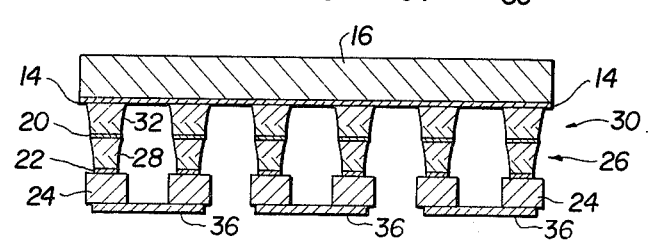

This is followed by a coating of photo-resist, not shown, which is applied over the exposed surfaces of the series connected pairs of diodes and the outer contact portions so that each of the diodes 32 and 28 is protected from copper contamination required in a subsequent step to be described. This and the following steps are similar to those described in the above-referenced Rosen, et al. publication and is incorporated herein by reference. Next the photo-resist existing on the outer surfaces of the gold contact portions 24 is exposed via a mask, not shown, that will form a cap slightly smaller than the top of each diode. Following this, copper is plated between the series connected diode pairs as shown in FIG. 1M. With the copper 34 being plated to the surface of the gold elements 24, another photo-resist, not shown, in reapplied, opening a hole, also not shown, that will provide a connection between two adjacent series connected diode pairs together. The connection is then effected by gold plating a birdge member 36 as shown in FIG. 1O. This gold bridge member is plated to a thickness of approximately 2 mils. Following this, the previously applied photo-resist material is removed, followed by the removal of the copper 34, leaving a structure as shown in FIG. 1P.

Subsequent to the removal of the copper intermediate the diode pairs, the photo-resist covering the surfaces of the diodes is removed, leaving an array of two series connected avalanche diodes connected in parallel via the gold metallization bridges 36 and which are now ready for testing.

Thus what has been shown and described is a series-parallel array of monolithically interconnected avalanche diodes which exhibits improved impedance levels for microwave oscillator and amplifier applications while eliminating the need for combining network schemes which are lossy and mechanically complicated. The series pairs of diodes are placed in near proximity to one another to reduce parasitics, however the spacing is made sufficiently large to prevent the thermal spreading of one series diode pair to overlap that of an adjacent pair during operation. A configuration as described herein is capable of operating with pulsewidths of up to 100 microseconds with a duty cycle of 5% for power levels in the order of 2 kilowatts while operating at an efficiency of 25%.

While there has been shown and described what is at present considered to be the preferred embodiment of the invention and its method of fabrication, further modification thereto will readily occur to those skilled in the art. It is not desired, therefore, that the invention be limited to the specific steps and arrangements shown and described, but it is to be understood that all equivalents, alterations aand modifications coming within the spirit and scope of the invention as defined by the following claims are herein meant to be included.

We claim as our invention:

1. In a microwave oscillator and amplifier comprised of an integrated array of monolithically interconnected semiconductor devices formed on a metallic substrate and having metallized bridge interconnection means, the improvement comprising:

first and second sets of TRAPATT diodes individually connected in series, via a respective metallic interface, between said substrate and said interconnection means, said interconnection means comprising a plurality of metallized air bridges connecting a predetermined number of said series connected diodes in parallel, whereby the series of diodes serves to raise the resistance of the diode network for peak power applications.

2. The array as defined by claim 1 wherein said first and second sets of diodes are comprised of avalanche diodes defined by respective semiconductor mesa regions on either side of said metallic interface.

3. The array as defined by claim 2 wherein each of said plurality of metallized air bridges connect two pairs of series connected diodes in parallel.

4. The array as defined by claim 1 wherein said first and second sets of diodes are both comprised of the same type of diode configuration.

5. The array as defined by claim 4 wherein said diode configurations are TRAPATT diodes formed in selectively defined regions of a pair of contiguous semiconductor bodies.

6. The array as defined by claim 1 wherein said first and second set of diodes comprise mesa type devices.

* * * * *